US012787534B2

(12) United States Patent
Brown et al.

(10) Patent No.: US 12,787,534 B2
(45) Date of Patent: Nov. 3, 2026

(54) SUBSTITUTIONAL BORON DOPANTS IN TRIPHENLYENE MOTIF FOR PHOTOVOLTAIC OR PHOTODIODE APPLICATIONS

(71) Applicant: The Government of the United States of America, as represented by the Secretary of the Navy, Arlington, VA (US)

(72) Inventors: Paul A. Brown, Laurel Springs, NC (US); Jakub Kolacz, Alexandria, VA (US); Christopher M. Spillmann, Annandale, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 341 days.

(21) Appl. No.: 18/775,612

(22) Filed: Jul. 17, 2024

(65) Prior Publication Data

US 2025/0107307 A1 Mar. 27, 2025

Related U.S. Application Data

(60) Provisional application No. 63/527,113, filed on Jul. 17, 2023.

(51) Int. Cl.

| | |
|---|---|
| ***H10K 30/10*** | (2023.01) |
| ***H10K 30/50*** | (2023.01) |
| ***H10K 30/60*** | (2023.01) |
| ***H10K 85/60*** | (2023.01) |

(52) U.S. Cl.
CPC .......... *H10K 30/10* (2023.02); *H10K 85/658* (2023.02); *H10K 30/50* (2023.02); *H10K 30/60* (2023.02)

(58) Field of Classification Search
None
See application file for complete search history.

(56) References Cited

U.S. PATENT DOCUMENTS

2019/0280209 A1 9/2019 Fujita

OTHER PUBLICATIONS

Madhu et al. Chem. Rev. 2021, 121, 8234-8284.
Sergeyev et al. Chem. Soc. Rev. 2007, 36, 1902-1929.
Wöhrle et al. Chem. Rev. 2016, 116, 1139-1241.
Segura et al. Chem. Soc. Rev. 2015, 44, 6850-6885.
Bernardo et al. Nat Commun. 2014, 5.
Heeger. Adv. Mater. 2014, 26, 10-28.
Armstrong et al. Macromol. Rap. Commun. 2009, 30, 717-731.
Vijay et al. Crystal Growth & Design 2021, 21, 200-206.
Idé et al. JACS 2014 136 (7), 2911-2920.
Wu et al. Nat. Commun. 2015, 6, 7340.
Jin et al. JACS 2022, 144, 30, 13704-13716.
Feng et al. Chem. Eur. J. 2022, 28, e202200770.

*Primary Examiner* — Eli S Mekhlin
(74) *Attorney, Agent, or Firm* — US Naval Research Laboratory; Roy Roberts

(57) ABSTRACT

Quasi-planar borane doped into (hexathiol)triphenylenes (TPP) operates as the photoactive component in the heterojunction of photovoltaics or photodiodes in heterojunctions with monolayer graphene.

6 Claims, 3 Drawing Sheets

SUBSTITUTIONAL BORON DOPANTS IN TRIPHENLYENE MOTIF FOR PHOTOVOLTAIC OR PHOTODIODE APPLICATIONS

REFERENCE TO RELATED APPLICATIONS

This application claims the benefit of U.S. Provisional Application No. 63/527,113, filed on Jul. 17, 2023. The provisional application and all other publications and patent documents referred to throughout this nonprovisional application are incorporated herein by reference.

TECHNICAL FIELD

The present disclosure is generally related to boron-doped triphenylenes.

DESCRIPTION OF THE RELATED ART

The compound hexakis(hexalkoxypentyl)triphenylene (HAT) comprises a polyaromatic core with peripheral aliphatic side groups that can self-assemble into a discotic liquid crystal phase (see ref. 1). HAT is a planar, aromatic, and synthetically versatile molecule that is extensively employed in many photovoltaic and organic semiconductor applications (see refs. 1-6). Substitutional dopants placed in the core provide a direct route to perturb the electronic properties of HAT molecules, thus making an ideal compound where the molecular properties may be tuned. As such, the molecule can be used as a photo-active layer. These layers are typically constructed into a planar heterostructure comprised of donor (D) and acceptor (A) thin films. Combining the planar geometry of derivative HAT [(hexathiol) triphenylenes (TPP)] molecules that self-assemble utilizing $\pi$-$\pi$ stacking is an important first step to forming soft organic semiconductors.

An important descriptor for charge transport in semiconducting materials concerns their electron or hole coupling. The strength of coupling between discrete quantum states is critical, allowing free carriers to transport across a device thereby generating current to deliver power or allow for carrier annihilation for photon emission see ref. 3). The ability to dissociate electron-hole pairs (excitons) depends on the coupling strength between frontier orbitals. Efficient exciton dissociation in the donor and acceptor complex depends intimately on the frontier orbital alignment, wherefore straddling, staggered, or inverted alignments may form at the donor-acceptor interface. The orbital alignments depend largely on differences in work function and chemical complementarity. For example, from a physical standpoint, copper phthalocyanine/buckminsterfullerene ($CuPC/C_{60}$) junctions form deep staggered orbital alignments that promote efficient exciton dissociation (see ref. 7). From a chemical viewpoint, bioinspired systems like dibromonaphthalimide form halogen-halogen linked donor-acceptor complexes that support efficient exciton dissociation along the supramolecular helical structure (see ref. 8). However, such systems display weaker coupling between frontier states compared with boron-TPP molecules, yet this is critical to establish exciton dissociation. For instance, dibromonaphthalimide obtains frontier orbital couplings on the order 80 meV, whereas more successful cases such as $SiO_2$/perylene/benzoperylene diimido diester heterojunction can obtain coupling above 100 meV (see refs. 8, 9).

The process of exciton dissociation begins with photon absorption promoting a singlet ground state to lowest excited state ($S_0 \rightarrow S_1$) transition in the boron-TPP molecule (FIG. 2). The coupling between the lowest unoccupied molecular orbital (LUMO) of boron-TPP and the conduction band edge of monolayer graphene (MLG) or the highest occupied molecular orbital/lowest unoccupied molecular orbital (HOMO/LUMO) of another compound enables carrier transfer. The transfer event must overcome the exciton binding between the electron and hole, otherwise radiative or nonradiative recombination could occur. However, larger band or orbital offsets help to suppress recombinant losses (see refs. 7, 9).

A need exists for organic semiconductors and photoactive devices having improved intermolecular coupling energy.

SUMMARY OF THE INVENTION

Described herein is the enhancement of electron and hole coupling in substitutionally doped triphenylene (TPP) cores (FIG. 1) and, consequently, an enhanced interaction of these boron-doped triphenylene compounds with graphene. The improved heterojunction applies to organic-based photovoltaics or photodiodes. Based on first-principles density functional theory (DFT) calculations, the doped TPP compounds show enhanced electron and hole coupling across dyad combinations and show low barrier Ohmic contacts with graphene, where the former originates from frontier orbital overlap between compounds. The formation of Ohmic contacts between doped TPP compounds and graphene arises from disparities in work functions between the two materials resulting in downward shifts of frontier orbitals from bulk. Additionally, the contact HOMO/LUMO separation in boron-TPP shows tunability and low electron transfer barriers.

In one embodiment, a heterojunction comprises a boron-doped (hexathiol)triphenylene; and a monolayer of graphene in intimate contact therewith.

BRIEF DESCRIPTION OF DRAWINGS

A more complete appreciation will be readily obtained by reference to the following Description of the Example Embodiments and the accompanying drawings.

FIG. 3A shows a schematic of a device comprised of a single junction boron-TPP photoactive layer in a planar junction capped with graphene electrodes while

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used herein, the singular forms "a", "an," and "the" do not preclude plural referents, unless the content clearly dictates otherwise.

As used herein, the term "and/of" includes any and all combinations of one or more of the associated listed items.

As used herein, the term "about" when used in conjunction with a stated numerical value or range denotes somewhat more or somewhat less than the stated value or range, to within a range of ±10% of that stated.

Overview

Figure 1:
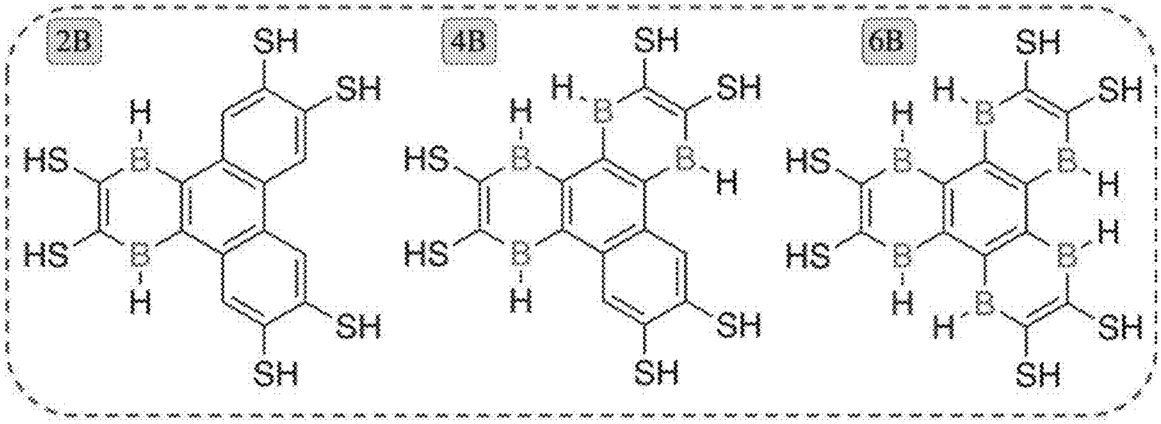
FIG. 1 depicts boron-TPP compounds: diboro(hexathio) triphenlyene (2B), tetraboro(hexathio)triphenylene (4B), and hexaboro(hexathio)triphenylene (6B).
Figure 3A:
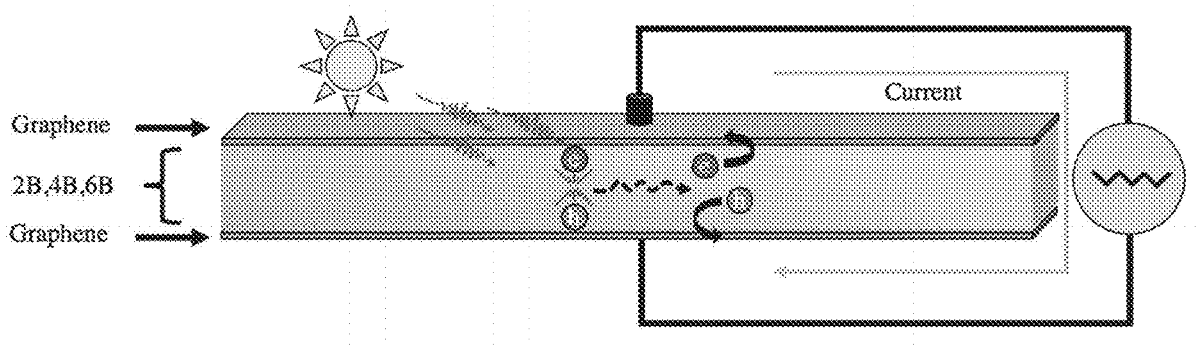
Figure 3B:
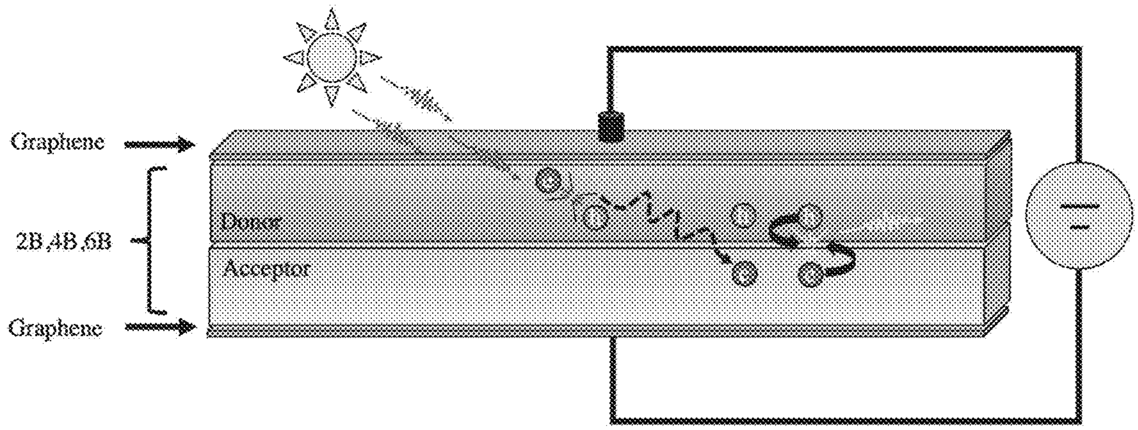
FIG. 3B shows a schematic of a second device composed of a multilayer heterojunction photodiode of donor-acceptor dyads of boron-TPP molecules in a planar heterojunction capped with graphene electrode.
Figure 4:
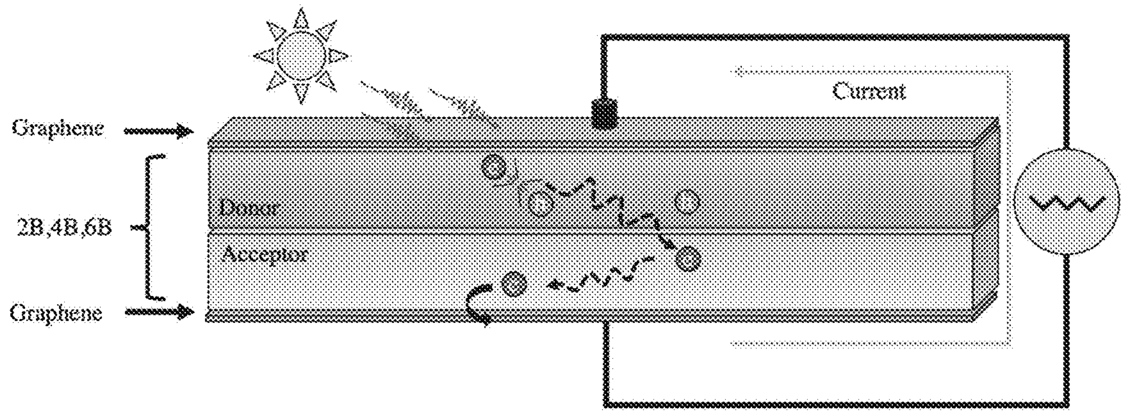
FIG. 4 provides a schematic of a multilayer heterojunction photovoltaic device of donor-acceptor boron-TPP dyads in a planar heterojunction capped with graphene electrodes.

Described herein are quasi-planar borane doped into (hexathiol)triphenylenes (TPP) operable as the photoactive component in the heterojunction of photovoltaics or photodiodes (as depicted in FIGS. 3A, 3B, and 4). The molecules feature boronic groups substituted for aromatic C—H located on outer phenyl groups of the (hexathiol)triphenylene motif, as shown in FIG. 1. A synthetic route for these compounds can be obtained via the guidance described in refs. 10 and 11, each of which is incorporated herein by reference for the purposes of disclosing techniques useful for preparing boron-doped polycyclic aromatic hydrocarbons. The successful substitution of borane was recently achieved in a heptacene scaffold through nucleophilic aromatic substitution via fluorinated arylborane precursor; and starphene was recently synthesized with boro-azine groups locked into the carbon network.

The present inventors have taken these boron-TPP dyads and use first principles DFT to calculate the molecular orbitals and interactions with each other and in proximity to MLG. The substitutional borane groups have a strong influence on frontier orbitals compared with TPP, and lower the HOMO/LUMO gap from 3.8 eV in classic (hexathiol) triphenylene to 1.841 eV for 2B, 1.793 eV for 4B, and 2.148 eV for 6B (referring to the molecular structures of FIG. 1), respectively. The consequence of lowering the HOMO/LUMO gap enables access to lower energy photons that are inaccessible to technologies utilizing TPP or its variants, see UV-vis spectra FIG. 6. Consequently, the tunability of shifting frontier orbital states in energy by doping boron pairs into TPP allows for control of electron and hole coupling.

For dyads of boron-TPP molecules, the electron and hole coupling can be adjusted with boron stoichiometry and exchanging combinations of boron-TPP, as seen in FIG. 1. The exchange of different boron-TPP molecules enables control over the molecular interface. The changes in frontier states for either 2B, 4B, or 6B provide a route to tune electron-hole coupling, and, thereby, tune the efficiency of exciton dissociation. This can be achieved in two ways: one, a single junction featuring only a single boron-TPP molecule could be spin-cast as the photoactive layer on MLG, and two, a multilayer junction could be spin-casted onto a MLG substrate where a donor and an acceptor is selected based on the frontier offsets as depicted in FIGS. 3A and 3B. In the former, a planar single junction capped with graphene could be established to create a photovoltaic, whereby the heterojunction with graphene (FIG. 2) can be tuned with HOMO/LUMO states straddling the Fermi energy of graphene. In fact, the borane stoichiometry influences graphene strongly, inducing a small band gap in the graphene electrode which creates the opportunity of exciton funneling onto MLG to promote radiative recombination allowing for photodiode operation as seen schematically in FIG. 3B. In the latter, a multilayer heterojunction comprised of donor-acceptor pairs spin-cast onto a substrate of graphene such that frontier orbital alignment at the molecule-molecule interface can be tuned via different combinations of boron-TPP. Orbital alignment may establish efficient exciton transfer between layers allowing free carriers to be subsequently transported to the graphene electrodes as seen in FIGS. 3B and. 4. Boron-TPP molecules as described herein can achieve electron-hole couplings that are 8 to 240 times greater compared to dibromonaphthalimide or 40 times compared to $SiO_2$/perylene/BP systems that exhibit strong electron-hole coupling. Hence, boron-TPP molecules are candidates for efficient exciton dissociation and transport.

Figure 2:
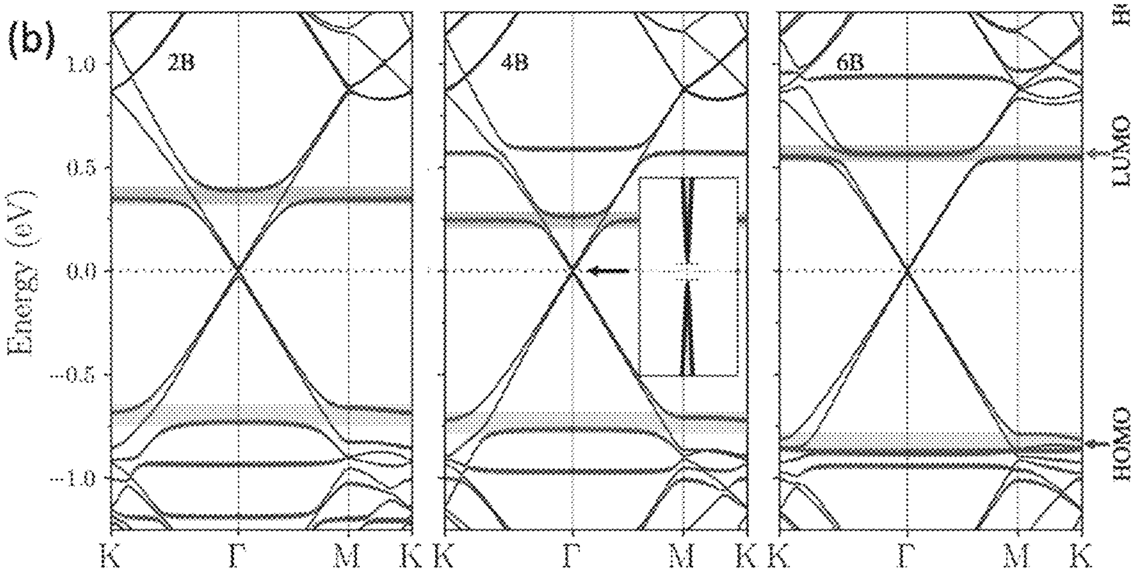
FIG. 2 illustrates band structure for the 2B, 4B, and 6B boron-TPP/monolayer graphene (MLG) contacts.
Figures 5A, 5B, 5C:
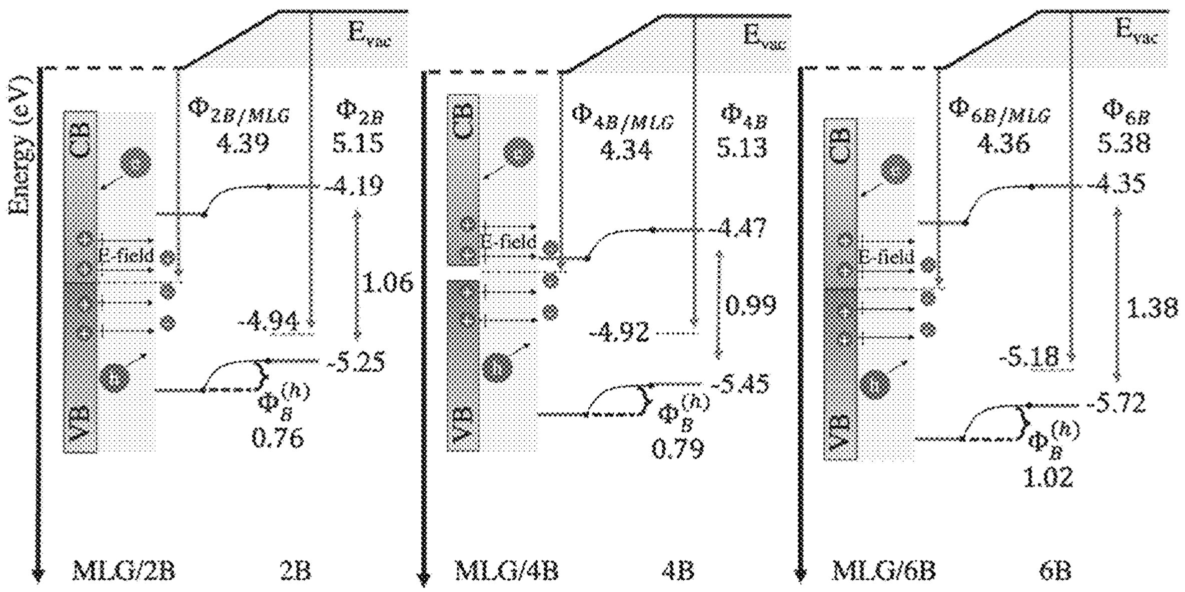
FIGS. 5A-5C depict a single molecule junctions of 2B, 4B, and 6B boron-TPP molecules with MLG showing the heterojunction properties.

The heterojunctions for the boron-TPP/MLG systems show band offsets that can favor either a photovoltaic or a photodiode single junction device (FIG. 2). The band offsets circumscribe the built-in potential or open-circuit voltage $$\left(E_{HOMO}^{D} - E_{LUMO}^{A}\right)$$

and the short-circuit current $$\left(E_{LUMO}^{D} - E_{LUMO}^{A}\right)$$

at the junction. In FIG. 2, the open-circuit voltage shows incremental decline as borane stoichiometry increases, yet the short-circuit band offset shifts more dramatically, particularly in the 4B/MLG junction. In the 2B/MLG and 6B/MLG cases, a larger band offset for short-circuit current is observed, which suggests that the energy disparity between the LUMOs of 2B and 6B allow for stronger electron transfer. Yet the 4B/MLG junction shows a smaller band offset between the LUMO of 4B and the conduction band minimum of MLG (see FIG. 2). Consequently, the offset in 4B/MLG provides a smaller barrier for potential recombinant losses at the interface compared with junctions in 2B/MLG and 6B/MLG. Nevertheless, boron-TPP molecules obtain excellent band offsets that can promote carrier transfer in both photovoltaic or photodiode applications. Furthermore, the heterojunction shows an Ohmic contact (FIGS. 5A-5C) rather than the more common Schottky contact. The latter contact promotes upward band bending that introduce a Schottky barrier to electron transfer; however, in Ohmic contacts, carrier transport from bulk frontier states should lower in energy near the graphene contact, which then lowers the barrier to electron and hole transport to the contact. Additionally, FIGS. 5A-5C shows that hole transport from graphene to the semiconducting boron-TPP molecules could observe a barrier $$\left(\Phi_{B}^{(h)}\right)$$

that is tunable. The tunability of $$\Phi_B^{(h)}$$

originates from changes to the molecular work function. Since the molecular work function is higher in these boron-TPP molecules compared with the work function of graphene, HOMO/LUMO states shift down in energy when in contact with the graphene electrode.

Further Embodiments

The boron-doped compounds could be used with other two-dimensional substrates such as transition metal dichalcogenides, MXenes, boron-nitride, allotropes beyond graphene, photoactive compounds, etc.

Practically any photoactive molecules and/or substrates can be considered. Examples include but are not limited to intrinsic polymers, modified polymers, mesoporous and microporous organic and inorganic systems, MOFs, zeolites, and biomaterials.

Alternative methods for deposition of the photosensitive capping layer can be considered, such as inkjet printing, screen-printing, lithography, gravure, roll-to-roll, spray-printing, batik, laser, flexography, thermal-printing, stamping, intaglio, lamination, adhesion, evaporation, sputtering and ablation.

Illumination of the device may take place directly using a coherent or incoherent light source. The light can cover any portion of the absorbance spectrum of the photoactive layer.

Advantages

Figures 6A, 6B:
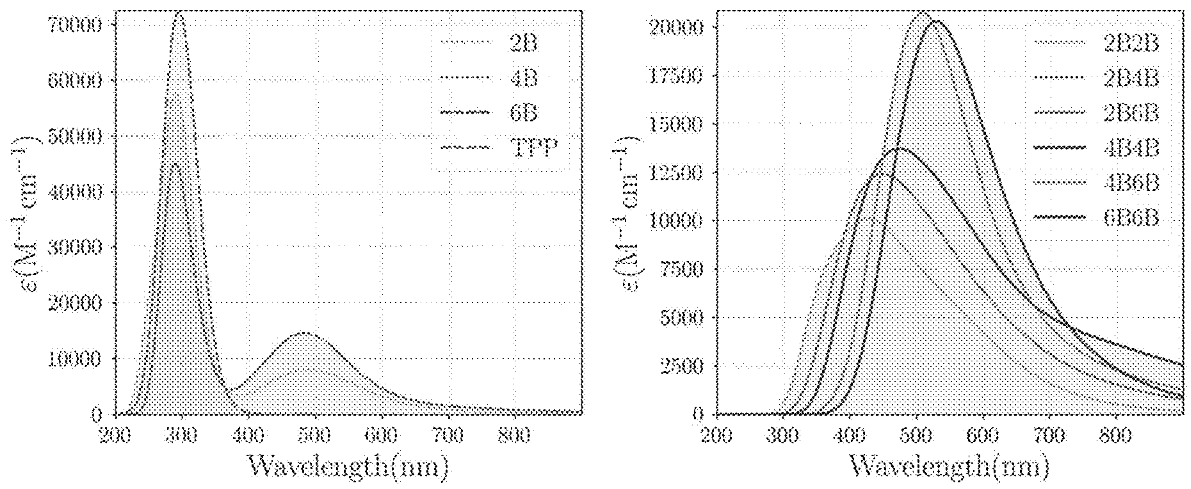
FIGS. 6A and 6B shows UV-vis spectra of gas-phase boron-TPP molecules (FIG. 6A) and homo-dyads of boron-TPP (FIG. 6B).

Incorporation of boron-doped molecules as a photoactive layer in contact with graphene provides a large degree of device tunability with variation in dopant stoichiometry. The enhanced electron and hole coupling across dyad combinations and low barrier Ohmic contacts with graphene provide an enhancement in organic-based applications including photovoltaics and photodiodes. Further these devices can operate across a large optical window of absorption, across the visible to near-IR light individually or in donor acceptor dyad pairs (FIGS. 6A and 6B).

Concluding Remarks

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

REFERENCES

1. Madhu, M.; Ramakrishnan, R.; Vijay, V.; Hariharan, M. Free Charge Carriers in Homo-Sorted π-Stacks of Donor-Acceptor Conjugates. *Chem. Rev.* 2021, 121, 8234-8284.
2. Sergeyev, S.; Pisula, W.; Geerts, Y. H. Discotic liquid crystals: a new generation of organic semiconductors. *Chem. Soc. Rev.* 2007, 36, 1902-1929.
3. Wohrle, T.; Wurzbach, I.; Kirres, J.; Kosti-dou, A.; Kapernaum, N.; Litterscheidt, J.; Haenle, J. C.; Staffeld, P.; Baro, A.; Giessel-mann, F.; Laschat, S. Discotic Liquid Crystals. *Chem. Rev.* 2016, 116, 1139-1241.
4. Segura, J. L.; Juárez, R.; Ramos, M.; Seoane, C. Hexaazatriphenylene (HAT) derivatives: from synthesis to molecular design, self-organization and device applications. *Chem. Soc. Rev.* 2015, 44, 6850-6885.
5. Bernardo, B.; Cheyns, D.; Verreet, B.; Schaller, R. D.; Rand, B. P.; Giebink, N. C. Delocalization and dielectric screening of charge transfer states in organic photovoltaic cells. *Nat Commun.* 2014, 5.
6. Heeger, A. J. 25th Anniversary Article: Bulk Heterojunction Solar Cells: Understanding the Mechanism of Operation. *Adv. Mater.* 2014, 26, 10-28.
7. Armstrong, N. R.; Wang, W.; Alloway, D. M.; Placencia, D.; Ratcliff, E.; Brumbach, M. Organic/Organic' Heterojunctions: Organic Light Emitting Diodes and Organic Photovoltaic Devices. *Macromol. Rap. Commun.* 2009, 30, 717-731.
8. Vijay, V.; Ramakrishnan, R.; Hariharan, M. Halogen-Halogen Bonded Donor-Acceptor Stacks Foster Orthogonal Electron and Hole Transport. *Crystal Growth & Design* 2021, 21, 200-206.
9. Julien Idé, Raphaël Méreau, Laurent Ducasse, Frédéric Castet, Harald Bock, Yoann Olivier, Jérôme Cornil, David Beljonne, Gabriele D'Avino, Otello Maria Roscioni, Luca Muccioli, and Claudio Zannoni Charge Dissociation at Interfaces between Discotic Liquid Crystals: The Surprising Role of Column Mismatch. *JACS* 2014 136 (7), 2911-2920.
10. Wu, D.; Kong, L.; Li, Y.; Ganguly, R.; Kinjo, R. 1,3,2,5-Diazadiborinine featuring nucleophilic and electrophilic boron centres. *Nat. Commun.* 2015, 6, 7340.
11. Jin, T.; Kunze, L.; Breimaier, S.; Bolte, M.; Lerner, H.; Jakle, F.; Winter, R.; Braun, M.; Mewes, J.; Wagner, M. Exploring Structure-Property Relations of B,S-Doped Polycyclic Aromatic Hydrocarbons through the Trinity of Synthesis, Spectroscopy, and Theory. *JACS* 2022, 144, 30, 13704-13716.
12. Feng, Y.; Zhou, J.; Qiu, H.; Schnitzlein, M.; Hu, J.; Liu, L.; Würthner. F.; Xie, Z. Boron-Locked Starazine—A Soluble and Fluorescent Analogue of Starphene. *Chem. Eur. J.* 2022, 28, e202200770.

What is claimed is:

1. A heterojunction comprising:

a boron-doped (hexathiol)triphenylene; and a monolayer of graphene in intimate contact therewith.

2. The heterojunction of claim 1, configured as a photovoltaic cell or as a photodiode.

3. The heterojunction of claim 1, wherein the boron-doped (hexathiol)triphenylene comprises one or more molecules selected from the group consisting of

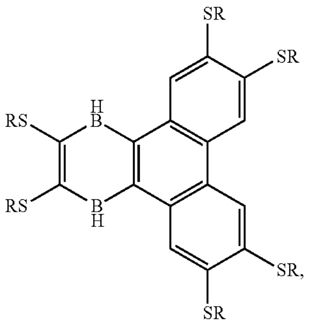
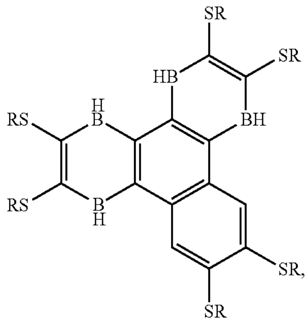
and
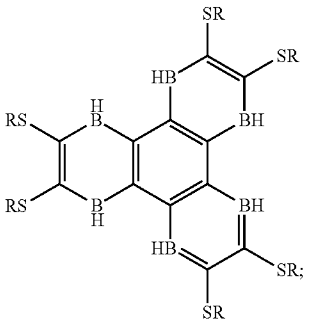
wherein R is H or an alkyl group.
4. The heterojunction of claim 3, configured as a photovoltaic cell or as a photodiode.
5. The heterojunction of claim 1, wherein the boron-doped (hexathiol)triphenylene comprises one or more molecules selected from the group consisting of
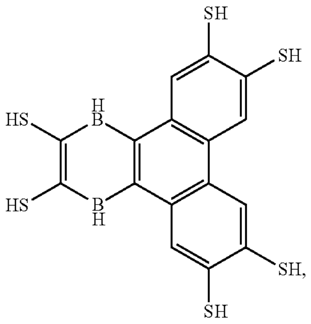
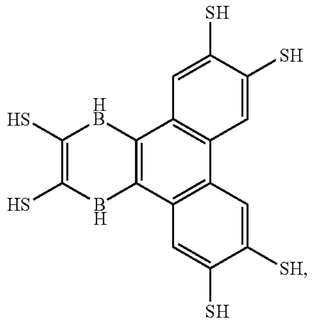
and
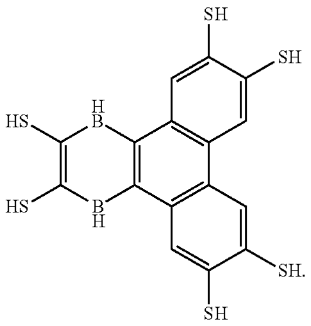
6. The heterojunction of claim 5, configured as a photovoltaic cell or as a photodiode.
* * * * *